(12) United States Patent
Jiang et al.

(10) Patent No.: US 6,600,188 B1
(45) Date of Patent: Jul. 29, 2003

(54) EEPROM WITH A NEUTRALIZED DOPING AT TUNNEL WINDOW EDGE

(75) Inventors: Chun Jiang, San Jose, CA (US); Sunil D. Mehta, San Jose, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 10/083,728

(22) Filed: Feb. 26, 2002

Related U.S. Application Data

(60) Provisional application No. 60/300,304, filed on Jun. 25, 2001.

(51) Int. Cl.[7] .................. H01L 27/108; H01L 29/76; H01L 29/94; H01L 31/119
(52) U.S. Cl. .................................... 257/296; 257/549
(58) Field of Search ................. 257/296, 314, 257/315, 322, 336, 344, 376, 549, 550

(56) References Cited

U.S. PATENT DOCUMENTS

| | | | | |
|---|---|---|---|---|
| 6,172,392 B1 | * | 1/2001 | Schmidt et al. | 257/315 |
| 6,294,810 B1 | * | 9/2001 | Li et al. | 257/321 |
| 6,455,375 B1 | * | 9/2002 | Jiang et al. | 438/264 |

* cited by examiner

*Primary Examiner*—David Nhu

(57) ABSTRACT

An improved method for fabricating a tunnel oxide window for use in an EEPROM memory cell is provided so as to produce better programming endurance. P-type lightly-doped drain regions are located at the polysilicon edges of the tunnel window. During the programming operation, the P-type lightly-doped drain regions are in contacting with the polysilicon edges. As a result, there is reduced or suppressed the tunneling current to the program junction region so as to improve the efficiency of programming.

10 Claims, 2 Drawing Sheets

EEPROM WITH A NEUTRALIZED DOPING AT TUNNEL WINDOW EDGE

This patent application claims priority from the provisional patent application with Ser. No. 60/300,304 filed on Jun. 25, 2001 and with the same title and inventors herewith. The provisional application with Ser. No. 60/300,304 is in its entirety incorporated herewith by reference.

BACKGROUND OF THE INVENTION

This invention relates generally to electrically erasable programmable read-only memory (EEPROM) devices. More particularly, it relates to a method for fabricating an EEPROM cell having an improved tunnel window which includes P-type lightly-doped drain regions located adjacent to and in contact with the edges of the polysilicon gate, thereby producing better programming endurance.

As is generally well-known in the art, electrically erasable programmable read-only memory devices can be both erased and programmed electrically without the necessity of exposure to ultraviolet light. Typically, an EEPROM memory cell is formed of three transistors consisting of a write or program transistor, a read transistor, and a sense transistor. Such a conventional EEPROM memory cell 10 is illustrated schematically in FIG. 1 and includes a write transistor 12, a read transistor 14, and a floating gate sense transistor 16. The read transistor 14 and the sense transistor 16 are connected so as to function as an inverter which creates a so-called "zero-power cell". The read transistor 14 has its source connected to a VD line 18 and its drain connected to the drain of the sense transistor 16. The sense transistor has its floating gate FG capacitively coupled via a tunneling oxide diode D to the source of the write transistor 12. The substrate of the tunnel diode D is a highly-doped active area which is referred to as a program junction. The floating gate FG is also capacitively coupled to Control Gate line CG via a gate capacitor C. The write transistor 12 has its drain connected to a word bitline WBL and its gate connected to a word line WL. The sense transistor 16 has its gate connected to the gate of the read transistor 14 and its source connected to a VS line 20.

The various voltages applied to the EEPROM memory cell 10 of FIG. 1 for programming and erasing operations, respectively, are listed in the Table below:

TABLE

|         | WBL | CG   | WL   | VD  | VS  |
|---------|-----|------|------|-----|-----|
| Program | Vpp | 0    | Vpp+ | 0   | 0   |
| Erase   | 0   | Vpp+ | Vdd  | Vdd | Vdd |

In order to program the EEPROM memory cell, an intermediate voltage Vpp (typically 11 V–12 V) is applied to the bitline WBL of the write transistor 12 and a relatively high voltage Vpp+ (typically 13 V–15V) is applied to the word line WL so as to pass the voltage Vpp to the source of the write transistor 12. It will be noted that the Control Gate line CG, VD line 18, and VS line 20 are all grounded. Under this bias condition, hot electrons are accelerated across the tunneling diode D from floating gate FG to source of the write transistor 12, creating a voltage drop therebetween. Since the electrons are tunneling from the floating gate FG, this results in the storing of a positive charge on the floating gate of the sense transistor 16.

In order to erase the EEPROM memory cell, a relatively high voltage Vpp+ (typically +13 V–15 V) is applied to the Control Gate line CG and a small positive voltage Vbb (i.e., +5 V) is applied to the word line WL, the VD line 18, and the VS line 20. The bitline WBL of the write transistor 12 is grounded. Under this bias condition, electrons are drawn back through the tunneling diode D from the source of the write transistor and onto the floating gate FG, creating a voltage drop therebetween. Since the electrons are tunneling to the floating gate, this results in the storing of a negative charge on the floating gate of the sense transistor 16.

As is also known in the art, the key to the programming and erasing operations for Fowler-Norheim current injection is the tunneling oxide diode D. More specifically, the important element is the portion of the tunnel oxide through which the electrons flow which is sometimes referred to as a tunneling window. For the conventional EEPROM memory cell, N-type lightly-doped drain (NLDD) regions are located adjacent to and in contact with the edges of the polysilicon gate. This creates increased tunneling current at the polysilicon edges during Fowler-Norheim programming which, in turn, degrades the programming performance.

In view of this, it would still be desirable to provide a method for fabricating a tunnel oxide window for use in an EEPROM process which reduces or eliminates the problem of tunneling current at the polysilicon edges during programming. This is achieved in the present invention by the provision of P-type lightly-doped drain regions located at the polysilicon edges of the tunnel window which serves to reduce or neutralize the doping density of the N-type program junction surface at the polysilicon edges.

SUMMARY OF THE INVENTION

In accordance with a preferred embodiment of the present invention, there is provided a method for fabricating a tunnel oxide window for use in an EEPROM memory device. A PRJ region is implanted in a semiconductor substrate. A tunnel oxide layer is formed on the top surface of the PRJ region. A floating gate electrode is then formed over the tunnel oxide on the top surface of the PRJ region. A first type of impurity ions is implanted into the PRJ region on the opposed sides of the floating gate electrode with the gate electrode acting as a mask so as to form P-type lightly-doped drain regions.

First and second sidewall spacers are formed on the respective opposed sides of the gate electrode. A second type of impurity ions is implanted into the PRJ region on the opposed sides of the gate electrode with the gate electrode and the first and second sidewall spacers acting as a mask so as to form highly-doped N+ diffusion regions.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Figure 1:
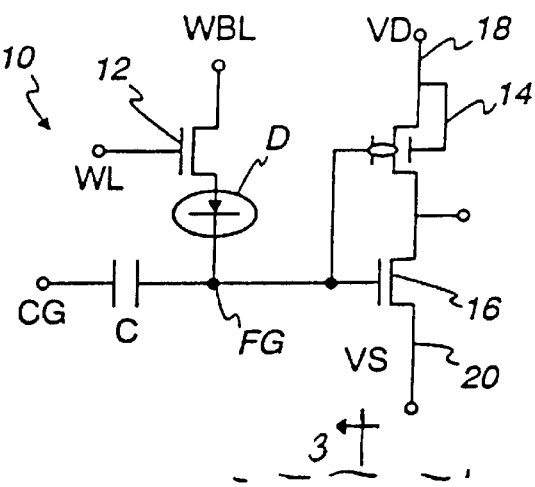
FIG. 1 is a schematic circuit diagram of a conventional EEPROM memory cell.

Before describing in detail the method for fabricating a tunnel oxide window of the present invention, it is believed that it would be helpful in understanding the principles of the instant invention and to serve as a background by explaining initially how a conventional tunneling oxide window design for forming the tunnel oxide diode D of FIG. 1 is obtained. Therefore, the conventional fabrication process employed for forming the EEPROM tunneling oxide window will now be described below as well as the problems associated therewith.

Figure 2:
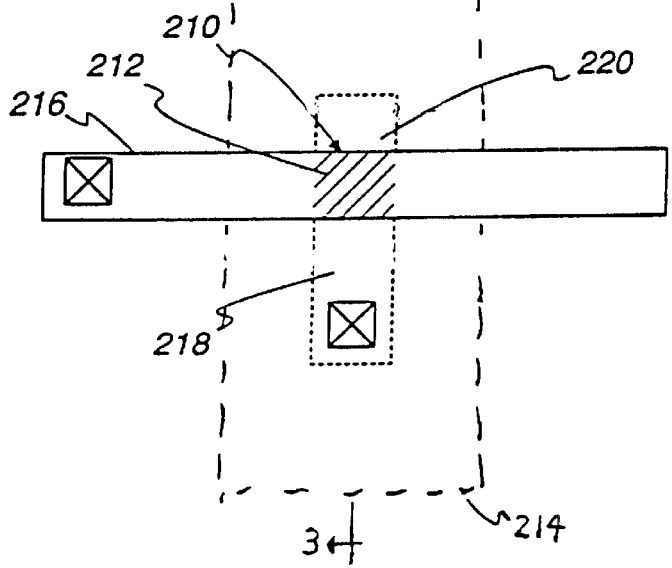
FIG. 2 is a top plan view of a prior art tunneling oxide window design for forming the tunnel oxide diode D of FIG. 1.

In FIG. 2, there is shown a top plan view of a conventional EEPROM tunneling oxide window design for forming the tunnel oxide diode D of FIG. 1 which is used for Fowler-Norheim current injection during programming and erasing operations. As can be seen, a tunneling window 210 is formed by a tunnel/gate oxide 212 formed over an active region defined by a program junction 214 and underneath a polysilicon floating gate 216. N+ diffusion regions 218, 220 are implanted on opposite sides of the floating gate 216.

Figure 3:
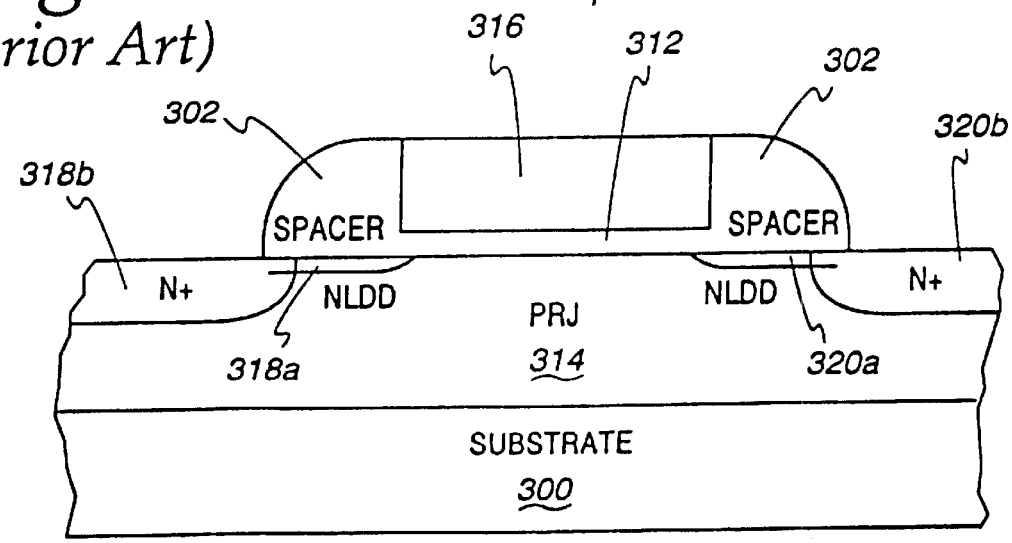
FIG. 3 is a cross-sectional view of the tunnel oxide window of FIG. 2, taken along the lines 3—3.

In FIG. 3, there is illustrated a cross-sectional view of the tunnel window design of FIG. 2, taken along the lines 3—3. A program junction (PRJ) implant is performed so as to form a PRJ region 314 in the surface of a silicon substrate 300. The PRJ region 314 is formed using a N-type impurity which may be phosphorus ions or arsenic ions. Then, a high voltage gate oxidation step is used to grow a HV gate oxide layer to a thickness of approximately 110 Å. This is performed by thermal oxidation in a dry oxide atmosphere at about 900° C. Thereafter, a rapid-thermal anneal (RTA) process is performed on the PRJ implant at 800–1000° C. for about 15 minutes. Next, a tunnel etch is used to remove the HV gate oxide from the surface of the PRJ region 314.

After the tunnel etch, a low voltage gate oxidation step is performed so as to grow a tunnel oxide/LV gate oxide layer 312 having a thickness of about 80 Å or less. Then, a polysilicon layer is deposited, patterned and etched so as to form the polysilicon floating gate 316. Using the gate electrode 316 as a mask, N-type lightly-doped drain (NLDD) regions 318a, 320a corresponding to respective certain portions of the N+ diffusion regions 218, 220 of FIG. 2 are formed by implanting phosphorus ions or arsenic ions.

Thereafter, a silicon dioxide film is deposited and an etchback is carried out so that sidewall spacers 302 are formed on each side of the gate electrode 316. Next, using the gate electrode 316 and the sidewall spacers 302 as a mask highly-doped N+ regions 318b, 320b corresponding to respective other portions of the N+ diffusion regions 218, 220 of FIG. 2 are formed by implanting phosphorus ions or arsenic ions.

However, in the above-described conventional EEPROM tunnel window design of FIGS. 2 and 3, the N+ diffusion regions 218, 220 are located adjacent to and in contact with the edges of the floating gate 216. This creates increased tunneling current at the polysilicon edges during the Fowler-Norheim programming which, in turn, degrades programming performance.

In order to eliminate the problem of the tunneling current at the polysilicon edges during programming, the inventors have proposed to replace the N-type lightly-doped drain regions located at the polysilicon edges of the tunnel window with P-type lightly-doped drain regions. In this manner, the P-type lightly-doped drain regions are used to reduce or neutralize the doping density of the N-type program junction surface at the polysilicon edges. As a consequence, the endurance performance will be improved by elimination of the increased tunneling current at the polysilicon edges during Fowler-Norheim programming.

The method for fabricating the tunnel oxide window design of the present invention so as to reduce or eliminate the tunneling current during programming operations will now be described with reference to FIGS. 4 and 5. As can be seen from FIG. 4, there is illustrated a top plan view, similar to FIG. 2, of an improved EEPROM tunnel oxide window design for forming the tunnel oxide diode D of FIG. 1 so as to reduce the tunneling current during programming. A difference between FIG. 4 and FIG. 2 are that P-type lightly-doped drain regions 518a, 520a have replaced the respective N-type lightly-doped drain regions 318a, 320a located at the polysilicon edges of the tunnel window.

In particular, a tunnel window 410 is formed by a tunnel oxide/gate oxide 412 grown over an active region defined by a program junction 414 and underneath a polysilicon floating gate 416. P+ diffusion regions 418a, 420a are implanted on respective first and second sides of the floating gate 416. N+ diffusion regions 418b, 420b are implanted on respective first and second sides of the floating gate 416 and the sidewall spacers 502a and 502b of FIG. 5.

Figure 4:
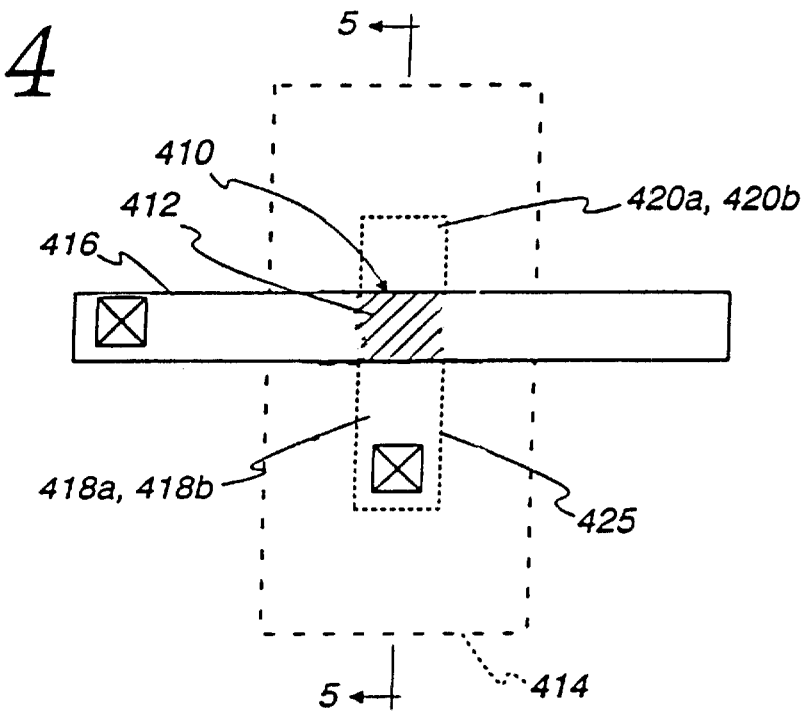
FIG. 4 is a top plan view of a tunnel oxide window design for forming the tunnel oxide diode D of FIG. 1, embodying the principles of the present invention.
Figure 5:
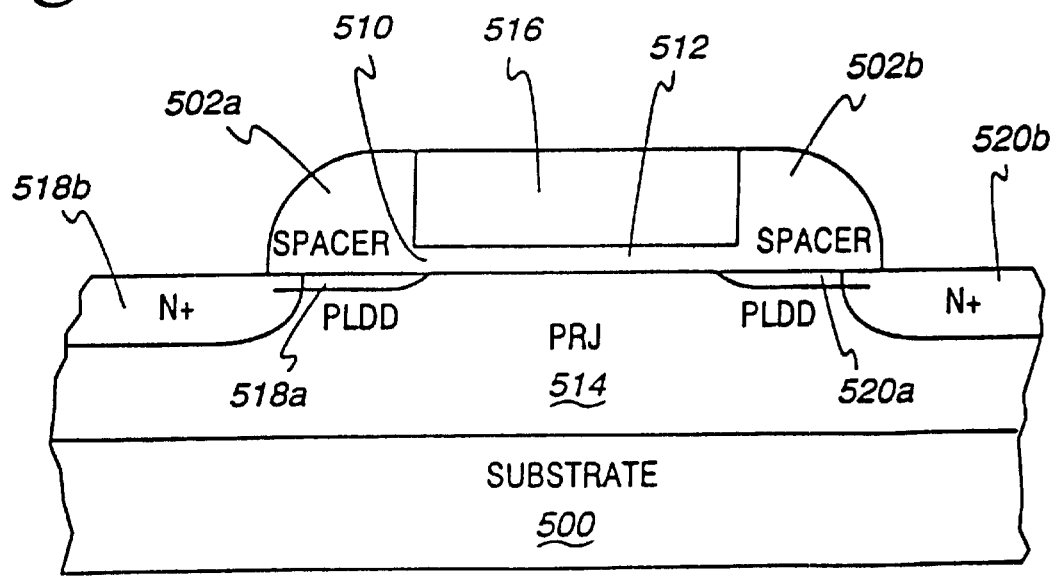
FIG. 5 is a cross-sectional view of the tunnel oxide window of FIG. 4, taken along the lines 5—5.

In FIG. 5, there is illustrated a cross-sectional view of the tunnel window design of FIG. 4, taken along the lines 5—5. A program junction (PRJ) implant is performed so as to form a PRJ region 514 in the surface of a silicon substrate 500. Then, a high voltage gate oxidation step is used to grow a HV gate oxide layer to a thickness of about 110 Å. This is performed by thermal oxidation in a dry oxide atmosphere at approximately 900° C. Thereafter, a rapid-thermal anneal (RTA) process is performed on PRJ implant at 800–1000° C. for about 15 minutes. Next, a tunnel etch is used to remove the HV gate oxide from the surface of the PRJ region 514.

After the tunnel etch, a low voltage gate oxidation step is performed so as to grow a tunnel oxide/LV gate oxide layer 512 having a thickness of approximately 80 Å or less. Then, a polysilicon layer is deposited, patterned, and etched so as to form the polysilicon floating gate electrode 516. A tunnel window 510 corresponding to the tunnel window 410 of FIG. 4 is defined by the intersection of the tunnel oxide layer 512 and the gate electrode 516. Unlike the prior art of FIG. 3, after the formation of floating gate 516, using the gate electrode 516 as a mask, P-type lightly-doped drain (PLDD) regions 518a, 520a corresponding to the P+ diffusion regions 418a, 420a of FIG. 4 are formed by implanting boron ions or $BF_2$ ions. The dose is preferably $5 \times 10^{14}$ ions/cm$^2$ and the energy is preferably at 35 KeV. Therefore, it can be seen that the PLDD regions 518a, 520a are located adjacent to and in contact the polysilicon gate edges at the tunnel window.

As a result, tunneling current from the PLDD regions 518a, 520a to the PRJ region 514 under the tunnel window 510 will be reduced or eliminated. Thus, the lower surface doping density in the PRJ region 514 at the polysilicon edges will reduce substantially the tunneling current at the polysilicon edge during Fowler-Norheim programming, thereby improving programming endurance.

Thereafter, using the gate electrode 516 and the sidewall spacers 502a, 502b as a mask, highly-doped N+ region 518b, 520b corresponding to the N+ diffusion regions 418b, 420b of FIG. 4 are formed by implanting phosphorus ions or arsenic ions. The dose is preferably about $2 \times 10^{15}$ ions/cm$^2$ and the energy is preferably at 40 KeV.

From the foregoing detailed description, it can thus be seen that the present invention provides an improved method for fabricating a tunnel oxide window for use in an EEPROM memory cell so as to produce better programming endurance. This is achieved by providing P-type lightly-doped drain regions located at the polysilicon edges of the tunnel window. As a result, the tunneling current at the polysilicon edges during the programming operation has been eliminated so as to provide enhanced performance.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof.

For example, the order of steps for forming the lightly doped region with a dopant of opposite conductivity type from the highly doped region as described and illustrated according to one embodiment herein is by way of example only, and the order of such steps may be varied to form the tunnel diode of the present invention. Therefore, it is intended that this invention not be limited to the particular embodiment disclosed as the best mode contemplated for carrying out the invention, but that the invention will include all embodiments falling within the scope of the appended claims.

What is claimed is:

1. A tunnel diode of an EEPROM memory cell, comprising:

a PRJ (program junction) region formed within a semiconductor substrate;

a tunnel layer formed on said PRJ region;

a floating gate electrode formed over said tunnel layer;

a lightly doped region comprised of a first dopant of a first conductivity type formed within said PRJ region on a side of said floating gate electrode;

a highly doped region comprised of a second dopant of a second conductivity type formed within said PRJ region, wherein said highly doped region is formed to contact a side of said lightly doped region further away from said floating gate electrode;

and wherein said first conductivity type of said lightly doped region is opposite to said second conductivity type of said highly doped region.

2. The tunnel diode of claim 1, wherein said lightly doped region is formed when said first dopant is implanted into exposed regions of said PRJ region, with said gate electrode acting as a mask.

3. The tunnel diode of claim 2, further comprising:

a sidewall spacer formed at said side of said gate electrode;

wherein said highly doped region is formed when said second dopant is implanted into exposed regions of said PRJ region, with said gate electrode and said sidewall spacer acting as a mask.

4. The tunnel diode of claim 1, wherein said first conductivity type of said first dopant for forming said lightly doped region is of P-type conductivity, and wherein said second conductivity type of said second dopant for forming said highly doped region is of N-type conductivity.

5. The tunnel diode of claim 1, wherein said tunnel layer is comprised of oxide, and wherein said floating gate electrode is comprised of polysilicon.

6. An EEPROM memory cell comprising:

a read transistor and a sense transistor having drains coupled together to form an output of said EEPROM memory cell and having gates coupled together to form a floating gate node;

a write transistor; and a tunnel diode comprising:

a PRJ (program junction) region formed within a semiconductor substrate;

a tunnel layer formed on said PRJ region;

a floating gate electrode formed over said tunnel layer;

a lightly doped region comprised of a first dopant of a first conductivity type formed within said PRJ region on a side of said floating gate electrode;

a highly doped region comprised of a second dopant of a second conductivity type formed within said PRJ region, wherein said highly doped region is formed to contact a side of said lightly doped region further away from said floating gate electrode;

and wherein said first conductivity type of said lightly doped region is opposite to said second conductivity type of said highly doped region;

and wherein said floating gate electrode of said tunnel diode is coupled to said floating gate node of said EEPROM memory cell, and wherein said highly doped region of said tunnel diode is coupled to a source of said write transistor of said EEPROM memory cell.

7. The EEPROM memory cell of claim 6, wherein said lightly doped region of said tunnel diode is formed when said first dopant is implanted into exposed regions of said PRJ region, with said gate electrode acting as a mask.

8. The EEPROM memory cell of claim 7, wherein said tunnel diode further comprises:

a sidewall spacer formed at said side of said gate electrode;

and wherein said highly doped region is formed when said second dopant is implanted into exposed regions of said PRJ region, with said gate electrode and said sidewall spacer acting as a mask.

9. The EEPROM memory cell of claim 6, wherein said first conductivity type of said first dopant for forming said lightly doped region is of P-type conductivity, and wherein said second conductivity type of said second dopant for forming said highly doped region is of N-type conductivity.

10. The EEPROM memory cell of claim 6, wherein said tunnel layer is comprised of oxide, and wherein said floating gate electrode is comprised of polysilicon.

* * * * *